United States Patent [19]

Mitani et al.

[11] Patent Number: 5,538,904
[45] Date of Patent: Jul. 23, 1996

[54] METHOD OF ESTIMATING QUANTITY OF BORON AT BONDING INTERFACE IN BONDED WAFER

[75] Inventors: Kiyoshi Mitani; Masatake Katayama, both of Takasaki; Kazushi Nakazawa, Nagano, all of Japan

[73] Assignee: Shin-Etsu Handotai Co., Ltd., Tokyo, Japan

[21] Appl. No.: 310,397

[22] Filed: Sep. 22, 1994

[30] Foreign Application Priority Data

Sep. 24, 1993 [JP] Japan ................................. 5-237751
Sep. 16, 1994 [JP] Japan ................................. 6-222267

[51] Int. Cl.$^6$ ................................................. H01L 21/66
[52] U.S. Cl. ........................ 437/8; 437/974; 148/DIG. 12
[58] Field of Search ................ 437/8, 974; 148/DIG. 12

[56] References Cited

U.S. PATENT DOCUMENTS

| | | | |
|---|---|---|---|
| 5,138,256 | 8/1992 | Murphy et al. | 437/8 |
| 5,232,870 | 8/1993 | Ito et al. | 437/974 |
| 5,362,667 | 11/1994 | Linn et al. | 437/974 |
| 5,418,172 | 5/1995 | Folster et al. | 437/8 |

FOREIGN PATENT DOCUMENTS

| | | |
|---|---|---|
| 488149A2 | 6/1992 | European Pat. Off. |
| 05198648 | 8/1993 | Japan. |
| 05198647 | 8/1993 | Japan. |

OTHER PUBLICATIONS

S. Wolf, "Silicon Processing For the VLSI Era vol. 2", Lattice Press, pp. 656–664, 668–669, (1990).
Datanbase WPIL, No. 86-179 223, Derwent Publications Ltd., London; JP-A-61 112 000 (Matsushita).

Primary Examiner—George Fourson
Assistant Examiner—Thomas G. Bilodeau
Attorney, Agent, or Firm—Nikaido, Marmelstein, Murray & Oram

[57] ABSTRACT

A method of estimating the amount of boron on the surface of silicone samples in which a plurality of reference samples shallowly ion-implanted with boron in different dosages are prepared and heat-treated under the same conditions of temperature and time as are used in a bonding heat treatment to obtain the bonded wafer, thereafter, the boron profile in the direction of the depth of the bonding interface in each reference sample is measured using a SIMS and compared with an actual boron profile at the bonding interface of a bonded wafer to be estimated so as to determine one reference sample whose boron profile is equivalent to the actual boron profile of the bonded wafer to be estimated, and finally a dosage of boron in the determined reference sample is estimated by convertion to be a surface density of boron presenting at the bonding interface of the bonded wafer to be estimated at an initial stage prior to the bonding heat treatment of the bonded wafer to be estimated. Thus, the boron profile obtained by SIMS measurement can be converted into the boron surface density with the result that the boron quantity at the bonding interface of a bonded wafer can be readily estimated to be a boron surface density.

13 Claims, 5 Drawing Sheets

METHOD OF ESTIMATING QUANTITY OF BORON AT BONDING INTERFACE IN BONDED WAFER

BACKGROUND OF THE INVENTION

1. Field of the Invention

The present invention relates to a method of estimating the quantity of boron presenting as an impurity at the bonding interface of a bonded wafer, in terms of the surface density of boron.

2. Description of the Related Art

Bonded wafers are generally classified into two groups depending on the type of bonding: one group being a direct bonding type wafer in which two semiconductor wafers are directly bonded to each other without an insulator between them, and the other group being a so-called SOI (Semiconductor On Insulator) type wafer in which a semiconductor wafer and an insulator wafer, such as oxidized wafers, are bonded together.

Regarding the direct bonding type wafer, when two wafers to be bonded are comprised of mirror-polished, single-crystalline silicon wafers (hereinafter referred to as "Si wafers"), a pair of mirror-polished surfaces of the Si wafers are placed in contact with each other, and after that the superposed Si wafers are heat-treated at a temperature above several hundred degrees to create the strong bonding interface of these two Si wafers. The bonded wafer thus fabricated is equivalent to an epitaxial wafer.

In the fabrication of the SOI type wafer, when two wafers to be bonded are comprised of Si wafers, a silicon dioxide ($SiO_2$) film is formed on the surface of at least one of two mirror-polished Si wafers. Then, the two Si wafers are superposed, with the $SiO_2$ film disposed between a pair of mirror-polished surfaces of the Si wafers, and heat-treated at a temperature above several hundred degrees to thermally bond the Si wafers. After the bonding heat treatment, the bonded wafer is thinned by grinding and polishing the surface of the composite insulator wafer including the $SiO_2$ film. Likewise, a silicon on quartz wafer can be also fabricated.

Bonded wafers are fabricated in a well-controlled clean room. However, since wafers which are cleaned and dried are exposed to air as they are standing by before bonding at room temperature, boron existing in a very small amount in air is adsorbed on wafer surfaces. The thus adsorbed boron may be trapped at the bonding interface in a bonded wafer.

The bonding interface is a region where mirror-polished surfaces of two wafers are directly bonded together in face to face relation. Upon the heat treatment for thermal bonding, the boron impurity trapped at the bonding interface diffuses into the Si single crystal layer, but it is unlikely to diffuse into the $SiO_2$ insulator layer.

Accordingly, in the case of the above-mentioned bonded wafer equivalent to the epitaxial wafer, the boron impurity diffuses into both of the two Si wafers bonded together. On the other hand, in the case of the SOI wafer composed of a Si wafer forming an activated layer devoid of an oxide film, and a base Si wafer having an oxide film, the boron impurity diffuses into the Si wafer forming the activated layer.

The boron contamination at the bonding interface may reverse the conductivity type of the bonded wafer and deviate the resistivity of the bonded wafer from the designed value. Such a defective bonded wafer, when fabricated into semiconductor devices, deteriorates the stability of performance characteristics of the semiconductor devices and eventually lowers the reliability of the semiconductor devices.

It is, therefore, essential to protect the bonding interface of bonded wafers against contamination. It is also necessary to establish a method of inspecting the presence of contamination and a method of estimating the degree of contamination if the contamination is present. However, when the interface contamination takes place, boron as an impurity diffuses, by the bonding heat treatment, in the direction of the depth of a Si single crystal layer with a certain concentration gradient. Accordingly, an objective estimation of the degree of boron contamination requires a consideration as to in which part of the depth and in which manner the estimation should be done.

It is optimum that the degree of boron contamination, i.e., the quantity of boron at the bonding interface at an initial stage before the bonding heat treatment can be estimated in terms of a surface density. However, no method has been proposed heretofore, which is based on this point of view and enables a measurement of the quantity of boron adsorbed on a wafer surface, e.g., the surface density (atoms/$cm^2$) of boron.

On the other hand, a change in the concentration (atoms/$cm^3$) of boron in the direction of the depth of a Si single crystal layer can be measured by the SIMS (Secondary Ion Mass Spectoroscopy). It is, therefore, possible to obtain a boron profile in the direction of the depth by measuring a change in the concentration of boron in the direction of the depth of a Si single crystal layer relative to the bonding interface of a bonded wafer after the bonding heat treatment.

Boron which is present at the bonding interface comes from boron uniformly adsorbed on a pair of wafer surfaces before bonding. The quantity of boron at this initial contamination stage is preferably estimated as a surface density of boron, if possible. However, the above-mentioned boron concentration (atoms/$cm^3$) change profile in the direction of the depth has shortcomings that (1) only a relative comparison under the same heat treating condition is possible, and (2) a surface density (atoms/$cm^2$) of boron trapped at the bonding interface at the end of superposition before the bonding heat treatment cannot be determined. In other words, the boron impurity trapped before the bonding heat treatment cannot be estimated or compared by the absolute value of boron surface density (atoms/$cm^2$).

SUMMARY OF THE INVENTION

With the foregoing drawbacks of the prior art in view, it is an object of the present invention to provide a method of estimating the quantity of boron impurity at the initial stage by conversion to a value of boron surface density (atoms/$cm^2$) from a boron profile obtained by the SIMS measurement.

To attain the foregoing object, the present invention provides a method of estimating the quantity of boron at the bonding interface in a bonded wafer, comprising the steps of: (a) preparing a plurality of reference samples shallowly ion-implanted with boron in different dosages; (b) heat-treating the reference samples under the same conditions of temperature and time as a bonding heat treatment which is achieved to obtain the bonded wafer; (c) thereafter, measuring a boron profile in the direction of the depth of the bonding interface in each of the reference samples using secondary ion mass spectoroscopy; (d) comparing the boron profiles of the reference samples with an actual boron profile at the bonding interface of a bonded wafer to be estimated to determine one reference sample whose boron profile is equivalent to the actual boron profile of the bonded wafer to be estimated; and (e) estimating by conversion the dosage of boron in said one reference sample to be a surface density of boron presenting at the bonding interface of the bonded wafer to be estimated at an initial stage prior to the bonding heat treatment of the bonded wafer to be estimated.

The reference samples are mirror-polished silicon single crystal wafers ion-implanted with boron at a low energy below 50 keV.

The above-mentioned steps of preparing a plurality of reference samples shallowly ion-implanted with boron in different dosages, heat-treating the reference samples under the same conditions of temperature and time as are used to achieve a bonding heat treatment to obtain the bonded wafer, and thereafter, determining a boron composition profile in the direction normal to the bonding interface in each of the reference samples can be accurately simulated using a process simulator. Preferably, the process simulator comprises a software package "SUPREM".

The "SUPREM" is a computer software package developed mainly by researchers in the Stanford University, Calif., U.S.A. and available from SILVACO INTERNATIONAL INC., U.S.A. It is the set of process simulation programs used for the fabrication of semiconductor devices. In a process of fabricating a semiconductor device, a complicated heat treatment is achieved during which time doped impurities are diffused by heat or thickness of an oxide film is changed by heat. The "SUPREM" is used to optimize various processing conditions of the semiconductor device fabrication process by way of simulating a doping profile or the like based on collected data without reliance upon actual fabrication and measurement.

According to the present invention, a plurality of reference samples are prepared by ion-implanting boron into mirror-polished Si single crystal wafers at a low energy below 50 keV. Subsequently, the reference samples are heat-treated under the same conditions of temperature and time as a bonding heat treatment achieved to obtain a bonded wafer, and after that a boron profile of each of the reference samples is measured by secondary ion mass spectoroscopy (SIMS). The boron profiles of the respective reference samples are compared with an actual boron profile at the bonding interface of the bonded wafer to determine one reference sample whose boron profile agrees with or is equivalent to the actual boron profile of the bonded wafer. Finally, the boron dosage of the determined reference sample is used to estimate a surface density (atoms/cm$^2$) of boron trapped at the bonding interface of the bonded wafer.

The reference samples may be prepared by using a process simulator ("SUPREM"). In this instance, an ion implanter implants boron in different dosages into a plurality of Si wafers, then a CVD (Chemical Vapor Deposition) oxide film is deposited on the ion-implanted surfaces of the Si wafers at a lower temperature than the temperature of the bonding heat treatment. Subsequently a boron profile, formed when each of the Si wafers is heat treated in an N$_2$ atmosphere under the same conditions in temperature and time as the bonding heat treatment is plotted. The thus plotted boron profiles of the respective Si wafers are compared with an actual boron profile at the bonding interface of a bonded wafer measured by the SIMS to find out or determine, on calculation, the boron profile which is in agreement with the actual boron profile. The boron dosage of the thus determined boron profile is estimated to be a surface density (atoms/cm$^2$) of boron at the bonding interface formed when the wafers are superposed.

The method of the present invention has various advantages as described below.

(1) The results of measurement on a boron profile obtained by the SIMS can be readily converted into a surface density of boron.

(2) The method can be also used to quantify boron adsorbed on a wafer surface.

(3) The quantity of boron at the bonding interface of a bonded wafer is converted into the surface density of boron. From this conversion, it is possible to determine the quantity of boron trapped at the bonding interface when the two wafers were superposed. Differences in the boron quantity between individual samples can be compared on the absolute value basis and hence used as reference data to improve various conditions for fabrication of the bonded wafer.

(4) The method can also be useful when applied in a method of quantifying impurities other than boron which are adsorbed on wafer surfaces before they are contacted together.

The above and other objects, features and advantages of the present invention will become manifest to those versed in the art upon making reference to the detailed description and the accompanying sheets of drawings in which preferred embodiments incorporating the principles of the present invention are shown by way of illustrative examples.

DETAILED DESCRIPTION OF THE INVENTION

Certain preferred embodiments of the present invention will be described below in greater detail with reference to FIGS. 1 through 5.

Cleaned n-type (100) 4 inch Si wafers (semiconductor wafers) and similar Si wafers having a 1 μm oxide film (insulator wafers) were prepared in pairs. After allowing them to remain or stand for different time periods of 5 minutes, 15 minutes, 1 hour, 5 hours and 24 hours in a clean bench, mirror-polished surfaces of the semiconductor and insulator Si wafer pairs were contacted together at room temperature and then heat-treated for 30 minutes at 1100° C. in an atmosphere of wet $O_2$ to thermally bond the wafer pairs, thus forming SOI type bonded wafers. After the bonding heat treatment, the SOI wafers were thinned by grinding off and etching off the insulator wafers including the oxide films. Thereafter, a boron profile relative to the bonding interface of each of the semiconductor wafers devoid of oxide films was measured by SIMS with the results shown in FIG. 1.

Figure 1:
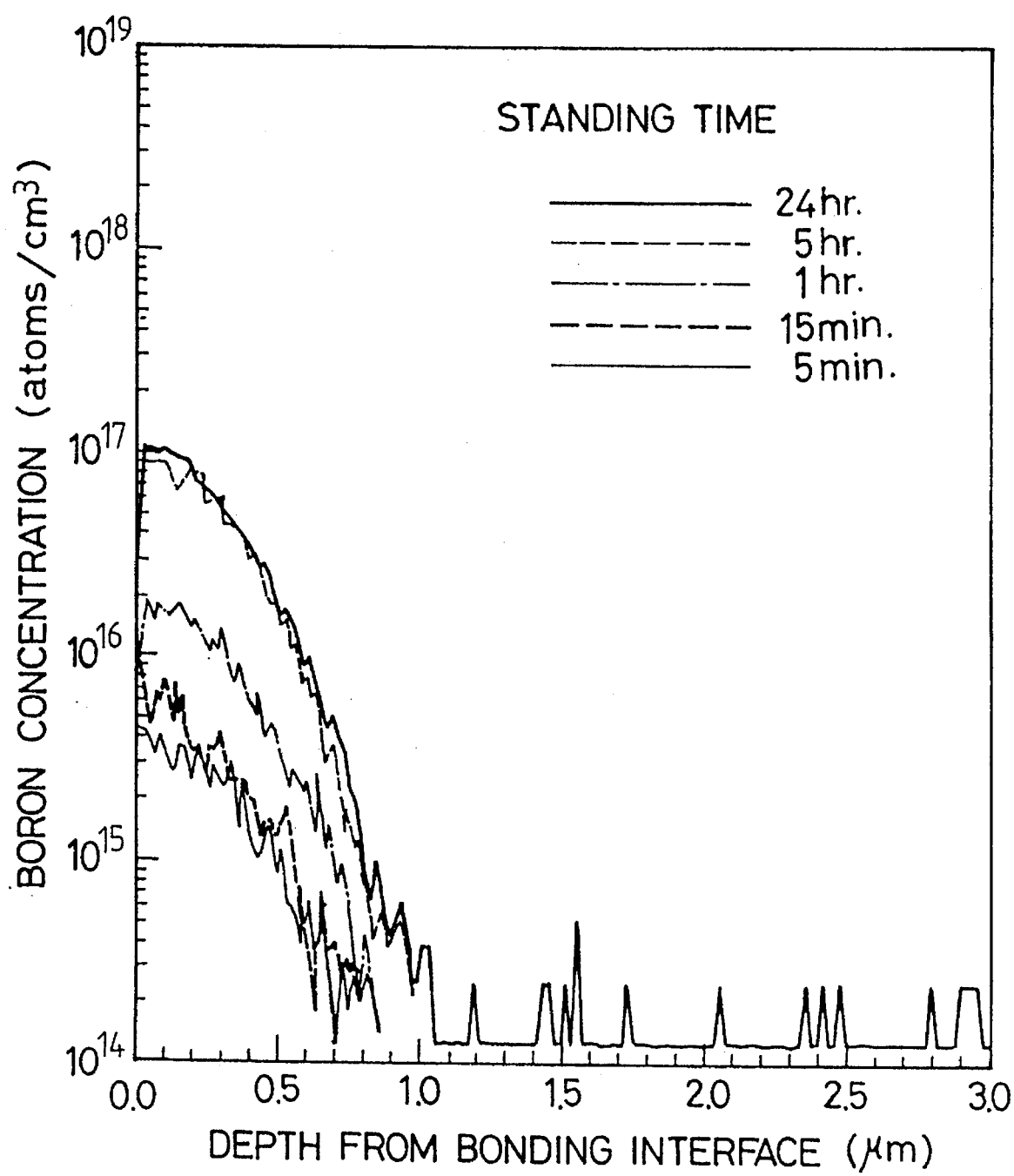
FIG. 1 is a graph showing the results of a SIMS profile of boron presenting at the bonding interface of each of a plurality of bonded wafers that are prepared by providing cleaned first Si wafers and second Si wafers having an oxide film, then allowing the first and second wafers to remain or stand for different time periods of 5 minutes, 15 minutes, 1 hour, 5 hours and 24 hours on a clean bench, subsequently mirror-polished surfaces of the first and second Si wafers are contacted and then heat-treated to thermally bond the first and second Si wafers.

It is apparent from the data shown in FIG. 1 that the quantity of boron at the bonding interface relatively increases with an increase in the standing time of the wafers. However, a comparison in absolute value (the total quantity of boron contaminating the bonding interface of each wafer) is not possible. For example, even if a maximum value of the boron concentration is estimated in terms of an absolute value, the maximum value is variable with a change in the conditions (temperature and time) of the bonding heat treatment. Accordingly, the maximum value of boron concentration cannot be estimated to be the absolute value. To enable estimation by the absolute value, it is necessary to obtain a surface density of boron at the bonding interface at a state before bonding heat treatment where the diffusion of boron has not yet taken place.

Using an ion implanter, a reference sample was prepared by shallowly implanting boron at an energy of 15 keV into a mirror-polished surface of a Si wafer in a dosage of $5.2 \times 10^{12}$ atoms/$cm^2$. Onto the boron-implanted surface of the Si wafer (reference sample), a thin oxide film was formed by CVD (Chemical Vapor Deposition). The reference sample was heat-treated under the same conditions as the aforesaid bonding heat-treating conditions except for the atmosphere (i.e., for 30 minutes at 1100° C. in $N_2$), and after that the oxide layer was etched off. A boron profile of the resultant reference sample was measured by SIMS with the result shown in FIG. 2. The boron profile shown in FIG. 2 can be also obtained by a simulation made under the same conditions as described above using a process simulator ("SUPREM").

Figure 2:
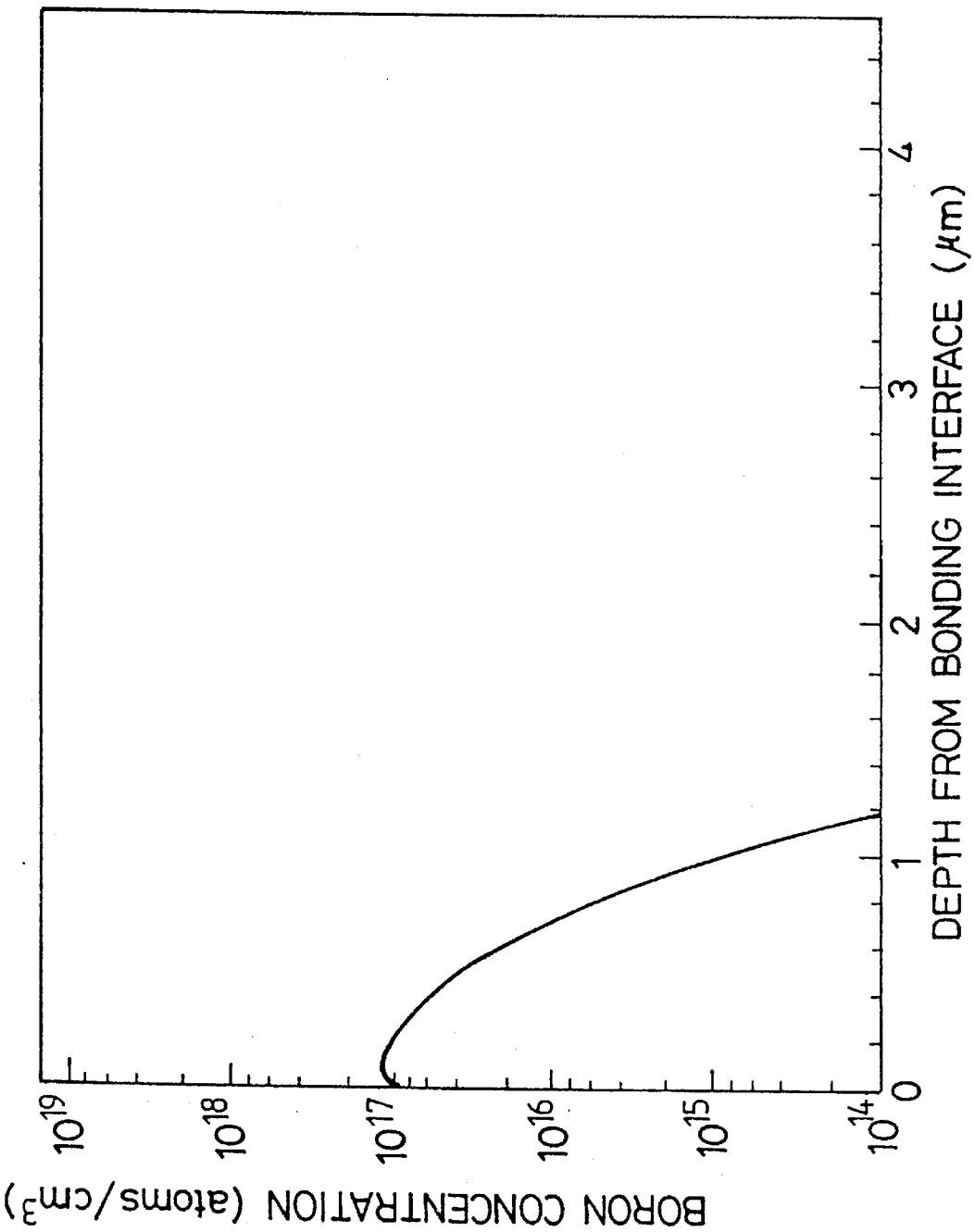
FIG. 2 is a graph showing a boron profile of a reference Si sample which is ion-implanted under a predetermined condition, followed by a heat treatment in a N$_2$ atmosphere at the same temperature and for the same time period as a bonding heat treatment used in the fabrication of a bonded wafer.

The depth of boron profile shown in FIG. 2 substantially agrees with one of the samples shown in FIG. 1 in which the boron was measured at the bonding interface of the bonded wafer left for 24 hours in the clean bench. From this agreement, it can be estimated that the bonded wafer allowed to stand for 24 hours on the clean bench has boron trapped at the bonding interface at a surface density of $5.2 \times 10^{12}$ atoms/$cm^2$.

In the fabrication of the SOI wafers described above, the wet $O_2$ atmosphere was used for process optimization. On the other hand, in the case of fabrication of the reference sample, a $N_2$ atmosphere was used for a reason described below. The reference sample is merely composed of a single Si wafer having a CVD oxide film deposited thereon. Accordingly, if the reference sample were heat treated in the wet $O_2$ atmosphere, boron dosed into the Si wafer would be caused to diffuse into the oxide film due to further oxidation of the oxide film. With the use of the $N_2$ atmosphere, the diffusion of dosed boron into the oxide film can be avoided.

Then, boron was implanted in different dosages (atoms/$cm^2$) into a plurality of Si wafers to prepare reference samples. Then, the same processes as described above were carried out with respect to the reference samples, and after that for each of the reference samples, the relation between the boron dosage (atoms/$cm^2$) and the maximum value of boron profile (atoms/$cm^3$) was plotted by a simulation achieved by the use of the process simulator ("SUPREM"). The thus obtained relation is shown in FIG. 3.

Figure 3:
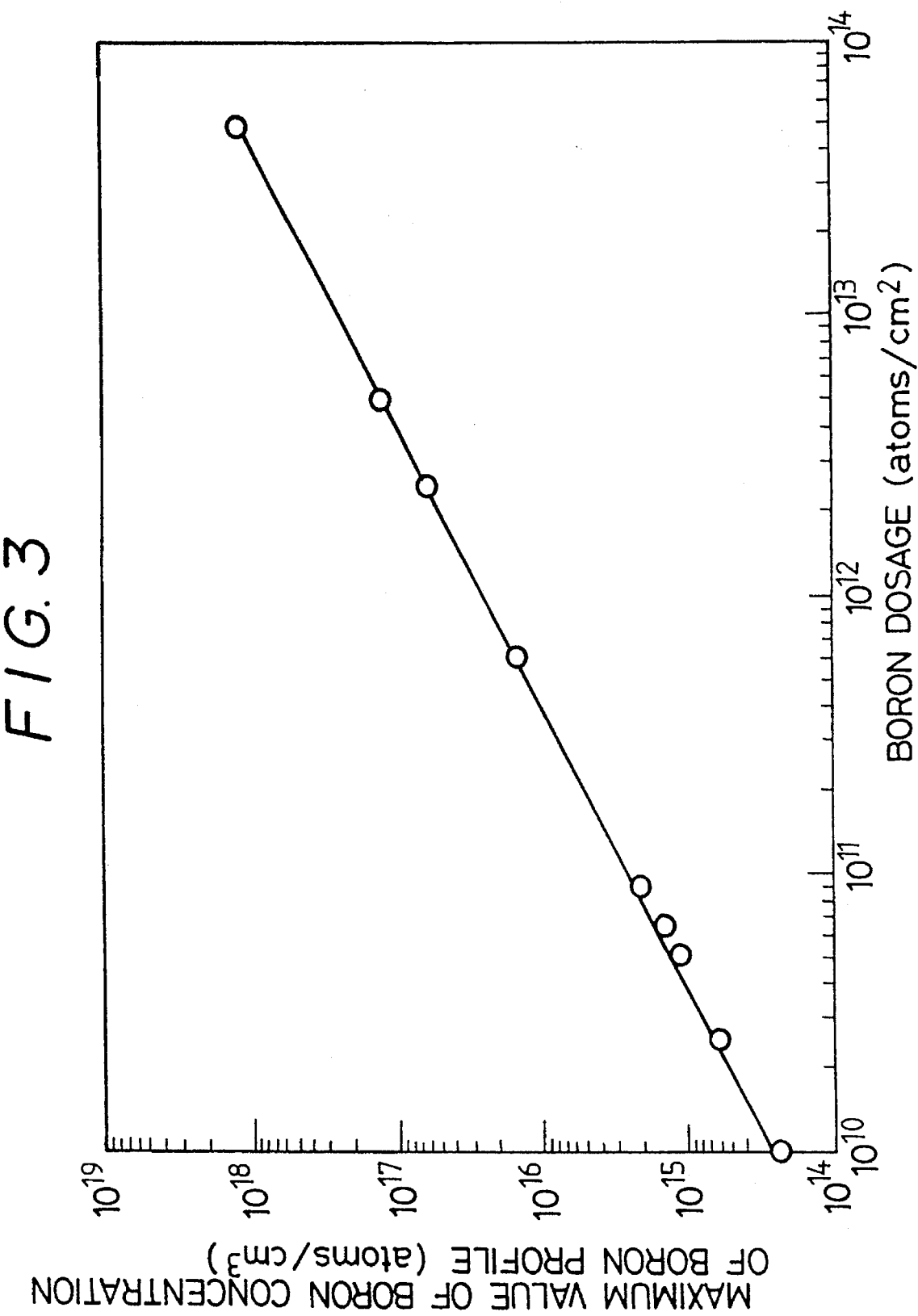
FIG. 3 is a graph showing the relation between the boron dosage (atoms/cm$^2$) and the maximum value (atoms/cm$^3$) of boron profile that is taken in conjunction with a plurality of reference samples having different boron dosages varied by a process simulator ("SUPREM")

From the graph shown in FIG. 3, we can obtain the surface density of boron based on the maximum value of the boron profile actually measured at the bonding interface of the bonded wafer by means of the SIMS. In this instance, the boron dosage is estimated as the boron surface density.

It is obvious that when the heat treatment conditions (temperature and time) change, the relation between the boron dosage (atoms/$cm^2$) and the maximum value of boron profile (atoms/$cm^3$) measured after the heat treatment should be renewed.

Figure 4:
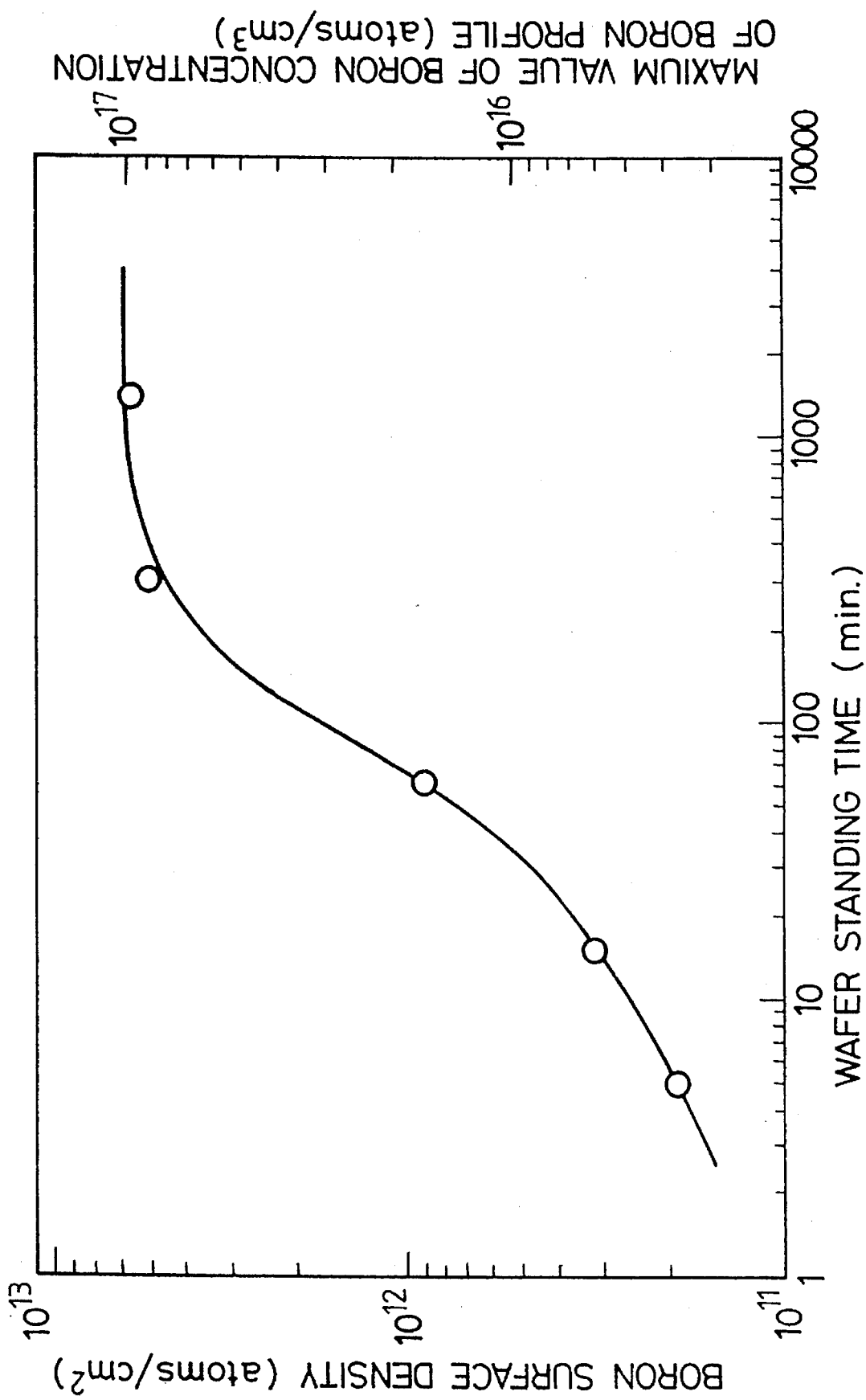
FIG. 4 is a graph showing the relation between the surface boron density at the bonding interface of each of the bonded wafers and the time period during which the Si wafers were allowed to remain or stand on a clean bench prior to bonding at room tempareture.

The experimental results shown in FIGS. 1 and 3 are used to determine the relation between the boron surface density at the bonding interface of the bonded wafer and the standing time during which the Si wafers are allowed to stand in the clean bench before being superposed at room temperature. The relation thus determined is shown in FIG. 4, wherein the axis of ordinates on the right-hand side indicates the maximum concentration value of boron profile measured by SIMS, and the axis of ordinates on the left-hand side indicates the boron surface density converted according to a method of the present invention.

Figure 5:
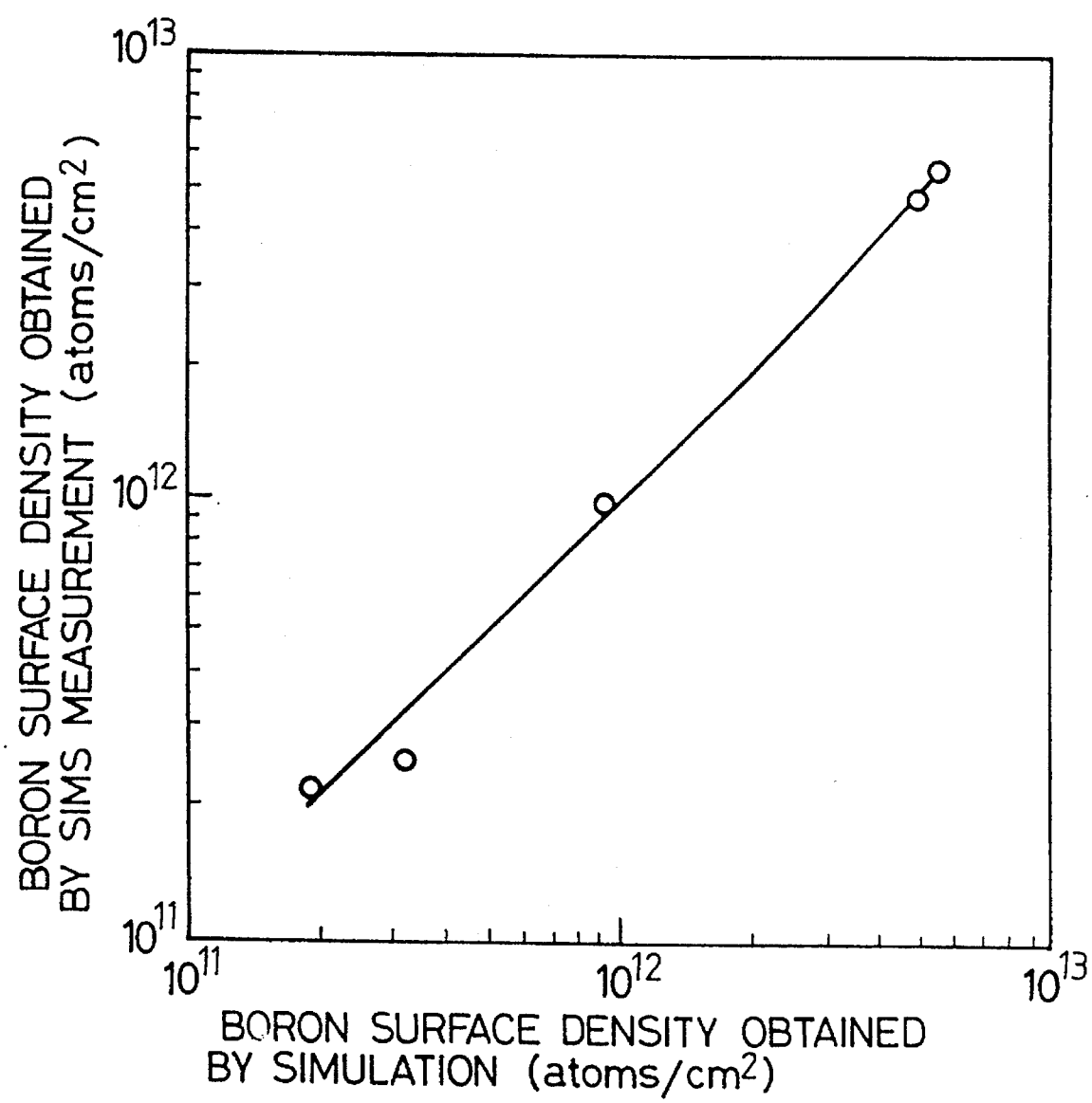
FIG. 5 is a graph showing the relation between the surface density of boron calculated by integrating a boron profile obtained by the SIMS measurement, and the surface density of boron obtained by the process simulator ("SUPREM").

FIG. 5 shows the result of a comparison made between the boron surface density obtained by a simulation according to the present invention, and the boron surface density obtained by integrating the boron profile obtained by the SIMS measurement in the direction of the depth from the bonding interface of the bonded wafer. It is apparent from FIG. 5 that both of the boron surface densities agree well with each other. This means that boron trapped at the $Si-SiO_2$ interface (bonding interface) diffuses substantially into the Si single crystal layer during the bonding heat treatment.

In the case of a bonded wafer equivalent to an epitaxial wafer, two wafers are superposed with mirror-polished wafer surfaces contacted together and then heat-treated for thermal bonding. On the bonding heat treatment, the boron impurity trapped at the bonding interface diffuses into both Si wafers. In order to form a reference surface, the bonded wafer is thinned by grinding and polishing to leave only one Si wafer. Then, in respect of the remaining Si wafer, the surface density of boron is obtained by the method of the present invention. The thus obtained boron surface density is doubled to determine by approximation the surface density in boron of the bonded wafer.

As described above, according to the method of the present invention, a boron profile obtained by SIMS measurement can be converted into a boron surface density (atoms/$cm^2$). Accordingly, the quantity of boron presenting at the bonding interface of a bonded wafer can be readily estimated to be a boron surface density.

What is claimed is:

1. A method of estimating the quantity of boron at a bonding interface in a bonded wafer, comprising the steps of:

(a) preparing a plurality of reference samples ion-implanted with boron in different dosages at an energy below 50 keV;

(b) heat-treating the reference samples under the same conditions of temperatures and time as are used as a bonding heat treatment to obtain a bonded wafer;

(c) thereafter, measuring a boron concentration profile in a direction normal to the bonding interface in each of the reference samples and in the bonded wafer using secondary ion mass spectroscopy;

(d) comparing the boron concentration profiles of the reference samples with the boron concentration profile of the bonded wafer at its bonding interface to determine at least one reference sample whose boron concentration profile is closest to the boron concentration profile of the bonded wafer; and (e) estimating, by comparison, the dosage of boron in said at least one closest reference sample to be the surface density of boron existing at the bonding interface of the bonded wafer prior to effecting bonding heat treatment of the bonded wafer.

2. A method according to claim 1, wherein the reference samples are mirror-polished silicon single crystal wafers.

3. A method according to claim 1 which further comprises depositing an oxide film on said ion implanted surface of said reference samples at a temperature lower than the temperature at which said bonding takes place and prior to the heat treatment thereof.

4. A method according to claim 3 including depositing said oxide film by CVD.

5. A method according to claim 1 wherein said heat treating is accomplished under a nitrogen atmosphere.

6. A method according to claim 1 wherein said reference samples comprise silicon wafers having an oxide film disposed thereon, and wherein said heat treatment is accomplished under conditions sufficient to avoid the substantial diffusion of dosed boron into said oxide film.

7. A method of estimating the quantity of boron at a bonding interface in a bonded wafer, comprising the steps of:

(a) using a computer assisted process simulator, simulating the preparation of a plurality of reference samples which have surfaces which have been ion-implanted with boron in different dosages at an energy below 50 keV and simulating the heat-treatment of such samples under the same conditions of temperatures and time as are used to bond wafers together to obtain the bonded wafer;

(b) from said simulation, calculating a simulated boron concentration profile in a direction normal to the bonding interface in each of the reference bonded wafer samples;

(c) bonding wafers together at a first temperature thereby forming an actual bonded wafer:

(d) determining a boron concentration profile in the actual bonded wafer in a direction normal to a bonding interface using secondary ion mass spectroscopy;

(e) comparing the boron concentration profiles calculated for the simulated reference samples with the boron concentration profile determined for the actual bonded wafer at its bonding interface to determine at least one simulated reference sample whose boron concentration profile is substantially equivalent to the boron concentration profile of the actual bonded wafer; and (f) estimating, by comparison, the dosage of boron in said at least one of said simulated reference samples to be the surface density of boron existing at the bonding interface of the actual bonded wafer prior to effecting bonding heat treatment of the wafer.

8. A method according to claim 7, wherein the simulated reference samples are simulated mirror-polished silicon single crystal wafers.

9. A method according to claim 7 which further comprises simulating the deposit of an oxide film on said ion implanted surface of said reference samples at a temperature lower than the first temperature at which said bonding takes place and prior to the heat treatment thereof.

10. A method according to claim 9 including simulating the deposit of said oxide film by chemical vapor deposition.

11. A method according to claim 7 wherein said simulated heat treating is simulated to have been accomplished under a nitrogen atmosphere.

12. A method according to claim 7 wherein said heat treating is simulated to have been accomplished on a silicon wafer having an oxide film disposed thereon and wherein said heat treating is simulated to have been accomplished under conditions at which boron does not substantially diffuse into said oxide film.

13. A method of estimating the quantity of boron at a bonding interface in a bonded wafer, comprising the steps of:

(a) preparing, or using a computer assisted process simulator simulating the preparation of, a plurality of reference samples ion-implanted with boron in different dosages at an energy level below 50 keV;

(b) heat-treating, or using a computer assisted process simulator simulating the heat treatment of, said reference samples under the same conditions of temperatures and time as are used as a bonding heat treatment to obtain a bonded wafer;

(c) thereafter, measuring, or calculating a simulated, boron concentration profile in a direction normal to the bonding interface in each of the reference samples and in the bonded wafer using secondary ion mass spectroscopy;

(d) comparing the boron concentration profiles measured or calculated for the reference samples with the boron concentration profile measured or calculated, respectively, for the bonded wafer at its bonding interface to determine at least one reference sample whose boron concentration profile is closest to the boron concentration profile of the bonded wafer; and (e) estimating, by comparison, the dosage of boron in said at least one closest reference sample to be the surface density of boron existing at the bonding interface of the bonded wafer prior to effecting bonding heat treatment of the bonded wafer.

* * * * *